(12) United States Patent
Huang et al.

(10) Patent No.: US 7,005,374 B2
(45) Date of Patent: Feb. 28, 2006

(54) METHOD FOR FORMING CONTACT HOLE

(75) Inventors: Tse-Yao Huang, Taipei (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/740,680

(22) Filed: Dec. 22, 2003

(65) Prior Publication Data

US 2005/0136674 A1 Jun. 23, 2005

(51) Int. Cl.
*H01L 21/4763* (2006.01)
(52) U.S. Cl. .................. 438/636; 438/702; 438/736
(58) Field of Classification Search ............. 438/700, 438/702, 736, 738, 945, 636
See application file for complete search history.

(56) References Cited

U.S. PATENT DOCUMENTS

| | | | |
|---|---|---|---|
| 6,008,123 A | * | 12/1999 | Kook et al. ............ 438/639 |
| 6,027,861 A | * | 2/2000 | Yu et al. .............. 430/316 |
| 6,287,951 B1 | * | 9/2001 | Lucas et al. ........... 438/618 |
| 2003/0129840 A1 | * | 7/2003 | Kumar et al. .......... 438/694 |

* cited by examiner

*Primary Examiner*—Caridad Everhart
(74) *Attorney, Agent, or Firm*—Bacon & Thomas, PLLC

(57) ABSTRACT

Disclosed is an improved method for forming contact holes. The method of the present invention includes the steps of providing a substrate; forming a plurality of operation layers on the substrate as necessary; forming a poly-silicon layer on the uppermost one of the operation layers; forming an anti-reflective layer on the poly-silicon layer; forming a photoresist layer on the anti-reflective layer to define the positions where the contact holes are to be formed; removing portions of the anti-reflective layer not covered with the photoresist layer; removing the photoresist layer; removing portions of the poly-silicon layer not covered with the anti-reflective layer; and using the residual poly-silicon layer as a mask to etch and form the contact holes. In the step of removing portions of the poly-silicon layer comprises partially removing portions of the poly-silicon not covered with the anti-reflective layer to form recesses, removing the anti-reflective layer, and opening the recesses of the poly-silicon to form openings.

10 Claims, 9 Drawing Sheets

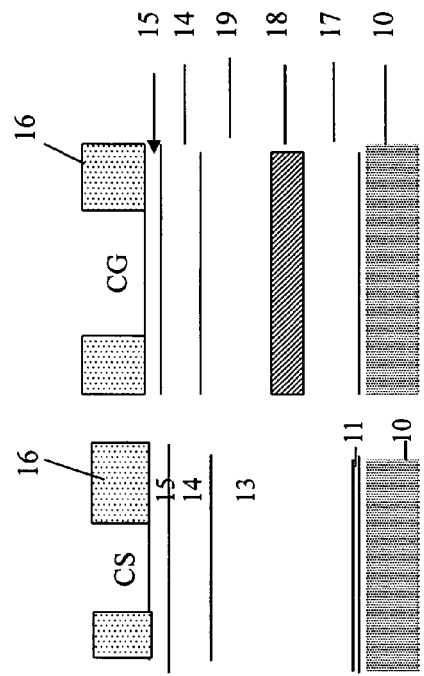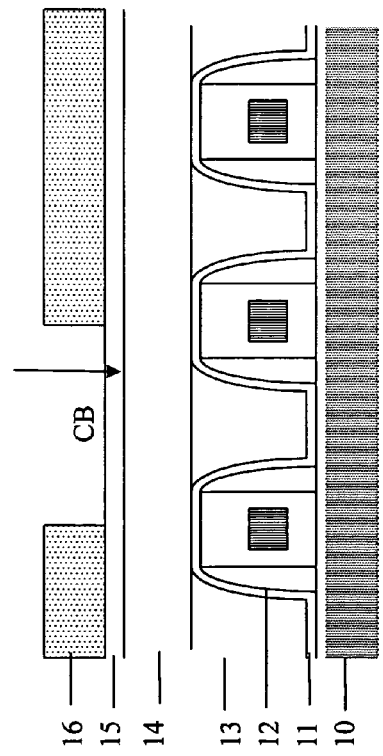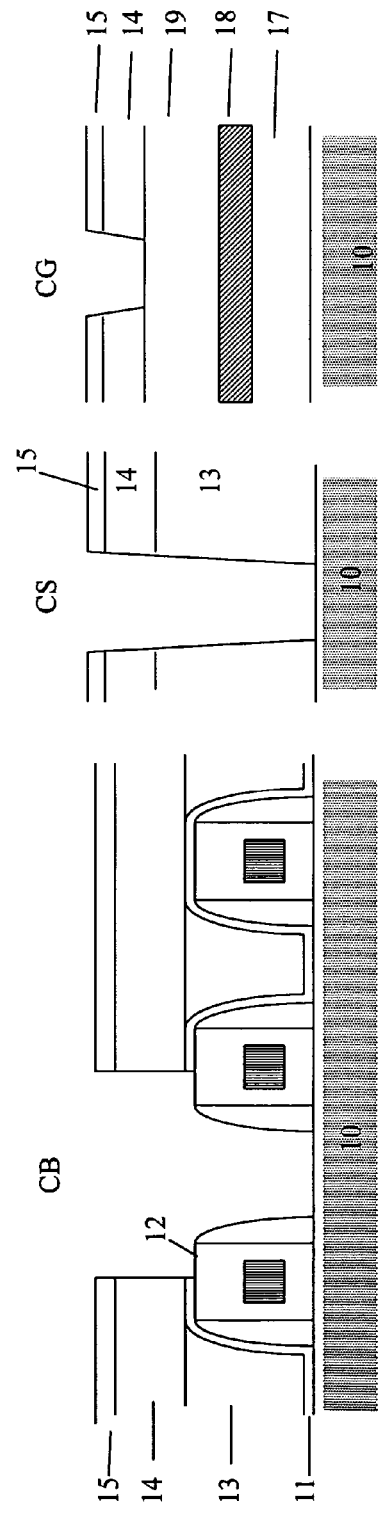
Fig. 1a
Fig. 1b

METHOD FOR FORMING CONTACT HOLE

BACKGROUND OF THE INVENTION

1. Field of the Invention

The present invention relates to a semiconductor integrated circuit device process, more specifically, to a method for forming contact holes in the semiconductor integrated circuit device, which can avoid the problem of the failure of the alignment marks due to light reflection.

2. Description of the Prior Art

In the process for semiconductor integrated circuits such as DRAM, formation of contact holes plays an important role in the process techniques. Take DRAM as an example, the contact holes include bit line contact holes, substrate contact holes, gate contact holes and the like.

FIG. 1a is a schematic diagram showing a prior art DRAM structure to where contact holes are to be formed. In this drawing, positions where a bit line contact hole (CB), a substrate contact hole (CS), and a gate contact hole (CG) are to be respectively formed are shown. At the portion where the bit line contact hole CB is to be formed, reference number 10 indicates a silicon substrate, 11 indicates a barrier nitride layer, 12 indicates a bit line region, 13 indicates a dielectric layer filled between the bit line regions 12 and 14 indicates an oxide layer on the dielectric layer 13 and the bit line regions 12. The material of the dielectric layer 13 comprises BPSC; and the material of the oxide layer 14 comprises TEOS, for example. On the oxide layer 14, a thin conductive layer, which can be a poly-silicon layer 15, is formed. Finally, a photoresist layer 16 is formed to define the position where the bit line contact hole CB is to be formed. At the portion where the substrate contact hole CS is to be formed, the barrier nitride layer 11 is formed on the substrate 10. On the barrier nitride layer 11, the dielectric layer 13, oxide layer 14 and thin poly-silicon layer 15 are formed. Finally, the position where the substrate contact hole Cs is to be formed is defined by using the photoresist layer 16. At the portion where the gate contact hole CG is to be formed, on the substrate 10, a conductive layer such as a poly-silicon layer 17, and a gate metal layer 18, of which the material can be WSi, are formed. On the gate metal layer 18, a cap nitride layer 19 is formed. Then, the oxide layer 14 and the thin poly-silicon layer 15 are formed on the cap nitride layer 19. Finally, the position where the gate contact hole CG is to be formed is defined by using the photoresist layer 16.

After the structure of FIG. 1a is etched and the photoresist layer 16 is removed, the resultant structure is shown in FIG. 1b. As can be seen from this drawing, at the portion of the gate contact hole CG, the cap nitride layer 19 acts as an etch stop layer. Accordingly, the depth of the etched contact hole fails to reach the gate metal layer 18.

In order to remove the unnecessary portion of the cap nitride layer 19, a poly hard mask 21 is formed on the partial structure where the gate contact hole CG is to be formed, as shown in FIG. 2. Then, the predetermined portion of the cap nitride layer 19 is removed by etching, so that the gate contact hole CG can reach the gate metal layer 18. Then, the poly hard mask 21 is removed, as shown in FIG. 3.

However, the material of the poly hard mask has a large reflection to yellow light such that strong light reflection occurs in the processes of developing and imaging. Accordingly, aligning marks would fail, making it difficult to align the marks. Therefore, additional aligning marks are required for the steps of developing, etching and so on. As shown in the drawing, due to misalignment, the etching is difficult to be perfectly performed such that some residual is left in the contact hole. Accordingly, the profile of the contact hole is influenced.

Therefore, there is a need for a solution to overcome the problems stated above. The present invention satisfies such a need.

SUMMARY OF THE INVENTION

An objective of the present invention is to provide an improved method for forming a contact hole, which can avoid the problem of alignment mark failure due to light reflection.

According to an aspect of the present invention, the improved method for forming a contact hole comprises steps of providing a substrate; forming a plurality of operation layers as required on the substrate; forming a conductive layer on the uppermost layer of the operation layers; forming an anti-reflective layer on the conductive layer; forming a photoresist layer on the anti-reflective layer to define a position where to a contact hole is be formed; removing a portion of the anti-reflective layer not covered by the photoresist layer; removing the photoresist layer; removing a portion of the conductive layer not cover by the residual anti-reflective layer; and forming a contact hole by etching with the residual conductive layer as a mask.

According to another aspect of the present invention, in the improved method for forming a contact hole, the step of removing the portion of the conductive layer includes sub-steps of partially removing the portion of the conductive layer not covered by the anti-reflective layer to form a recess; removing the anti-reflective layer; and opening the recess of the conductive layer to form an opening.

According to a further aspect of the present invention, in the improved method for forming a contact hole, the material of the anti-reflective layer comprises nitride.

According to still another aspect of the present invention, in the improved method for forming a contact hole, the material of the anti-reflective layer comprises SiON.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

FIGS. 1a and 1b are schematic sectional diagrams illustrating steps of a conventional method for forming a contact hole;

DETAILED DESCRIPTION OF THE PREFERRED EMBODIMENT

An embodiment of the present invention will be described in detail with reference to the accompanying drawings.

Figure 3:
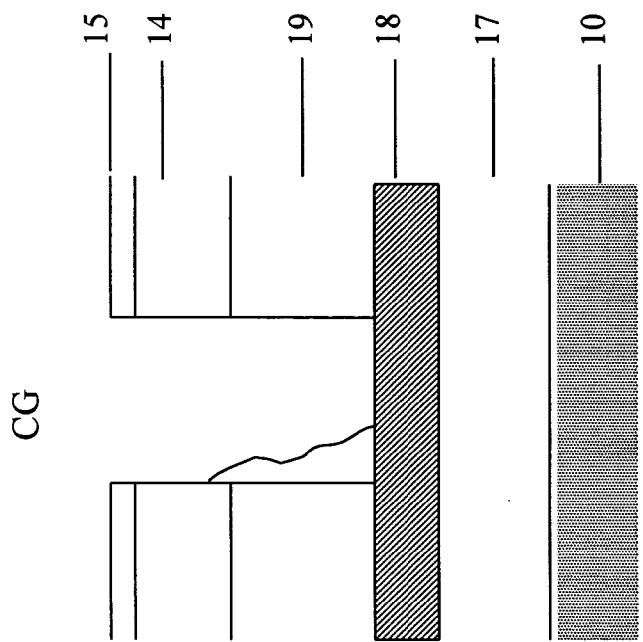
FIG. 3 is a schematic section diagram illustrating the gate contact hole formed from the structure of FIG. 2.
Figure 2:
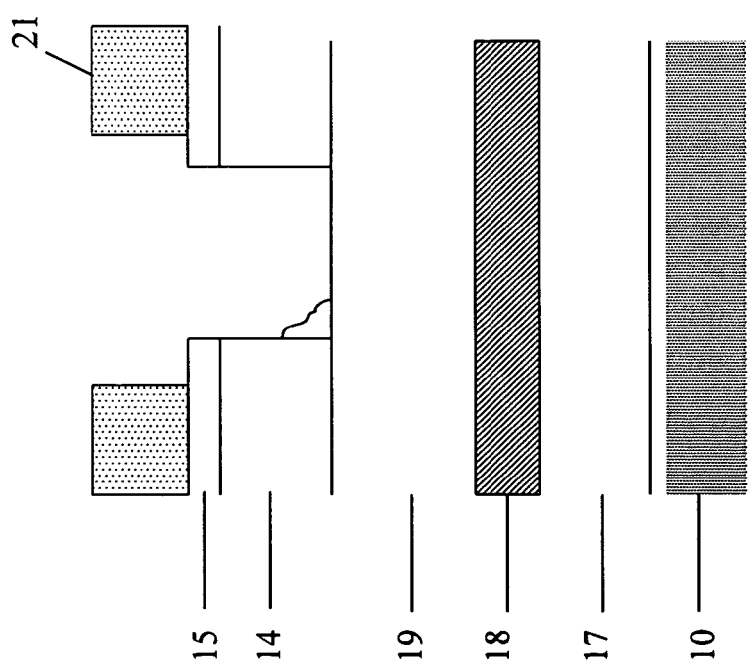
FIG. 2 is a schematic sectional diagram illustrating a step of using a poly hard mask in accordance with the conventional method for forming a gate contact hole.
Figure 4A:
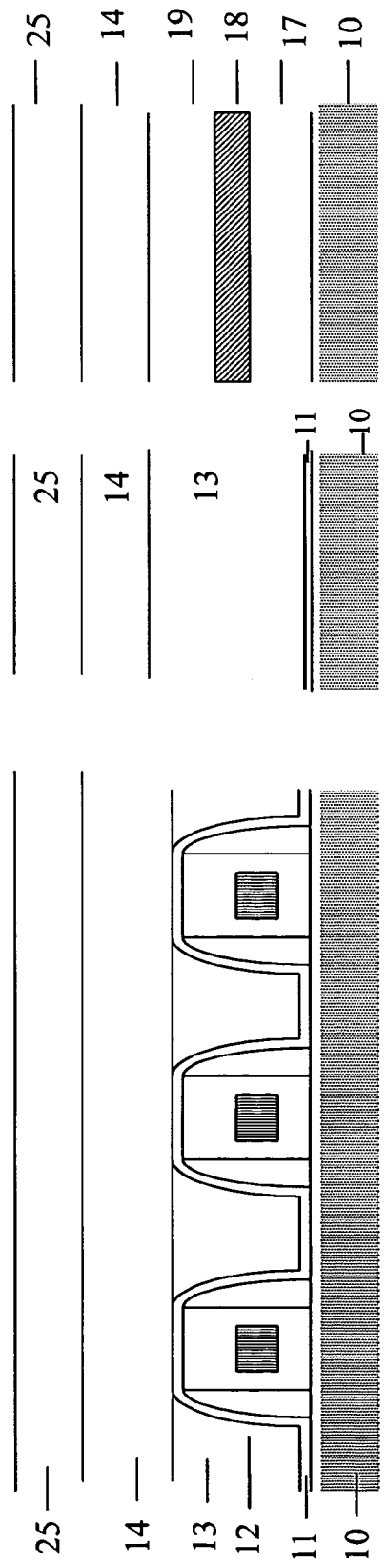
FIGS. 4a to 4h are schematic sectional diagrams illustrating steps of a method for forming contact holes in accordance with the present invention.

FIG. 4a shows a step of a method for forming contact holes in accordance with an embodiment of the present invention. In this drawing, the same reference numbers as those in FIG. 1a indicate the similar parts, and therefore the relevant descriptions are omitted herein. As shown, in accordance with the present invention, a conductive layer, which is preferably a poly-silicon layer 25, is formed on the oxide (dielectric) layer 14. The difference between the present invention and the prior art is the thickness of the poly-silicon layer. In the prior art, the thickness of the poly-silicon layer 15 is about hundreds of angstroms. In this embodiment of the present invention, the thickness of the poly-silicon layer 25 is about 1200~1500 Å.

Figure 4B:
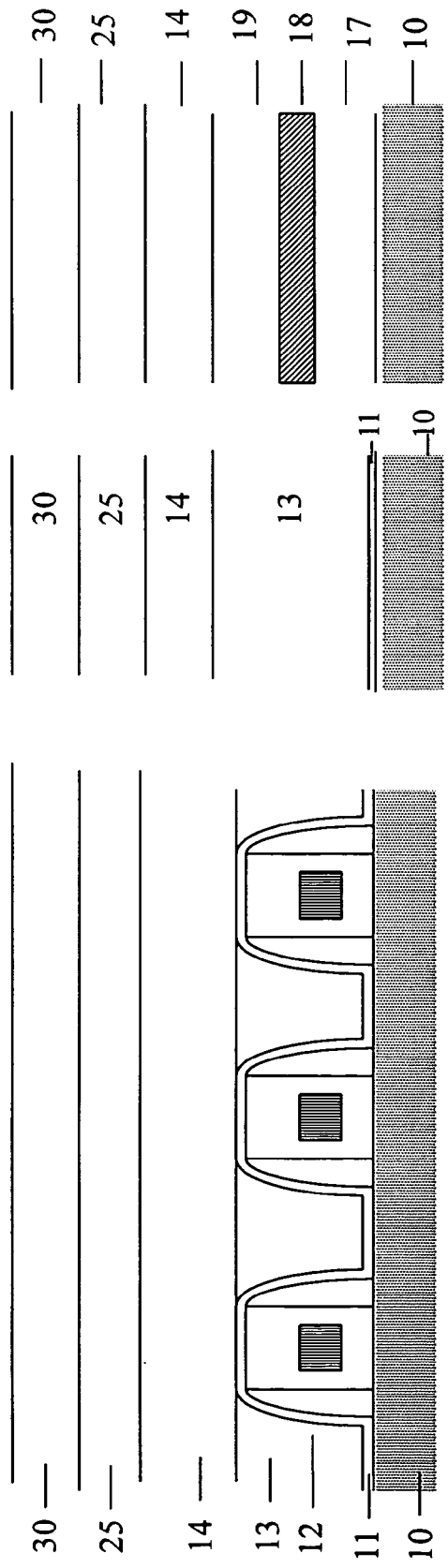

Then, as shown in FIG. 4b, an anti-reflective layer 30, which has a low reflectivity to yellow light, is formed on the poly-silicon layer 25. The etching selectivity ratio for the anti-reflective layer 30 to the poly-silicon layer 25 should be sufficiently large. Preferably, the material of the anti-reflective comprises nitride, such as SiON. For dilute HF etching, the selectivity ratio for SiON to poly-silicon can reach 100:1.

Figure 4C:
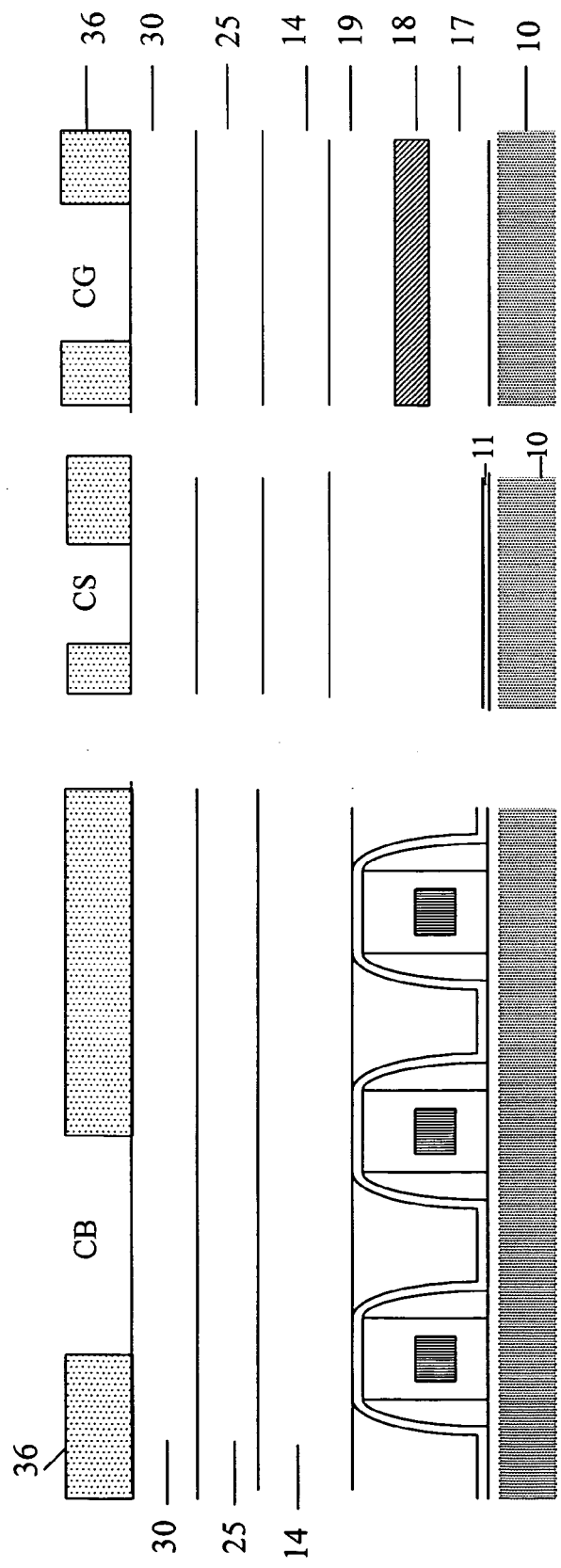

Subsequently, a photoresist layer 36 is formed on the anti-reflective layer 30 to define the positions of the bit line contact hole CB, substrate contact hole CS and gate contact hole CC; as shown in FIG. 4c.

Figure 4D:
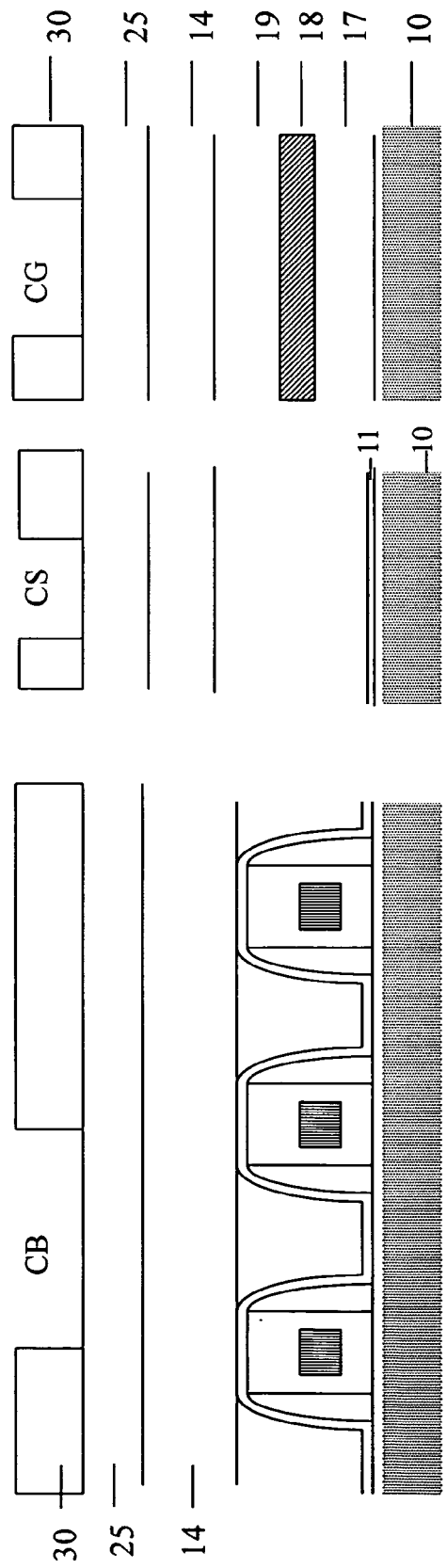

The portion of the anti-reflective layer 30 not covered by the photoresist 36 is then removed, as shown in FIG. 4d. As mentioned above, for dilute HF etching, the selectivity ratio for SiON to poly-silicon is about 100:1. Accordingly, the remaining anti-reflective layer 30 can act as a mask for defining positions to be etched in the subsequent step of etching the poly-silicon layer 25.

Figure 4E:
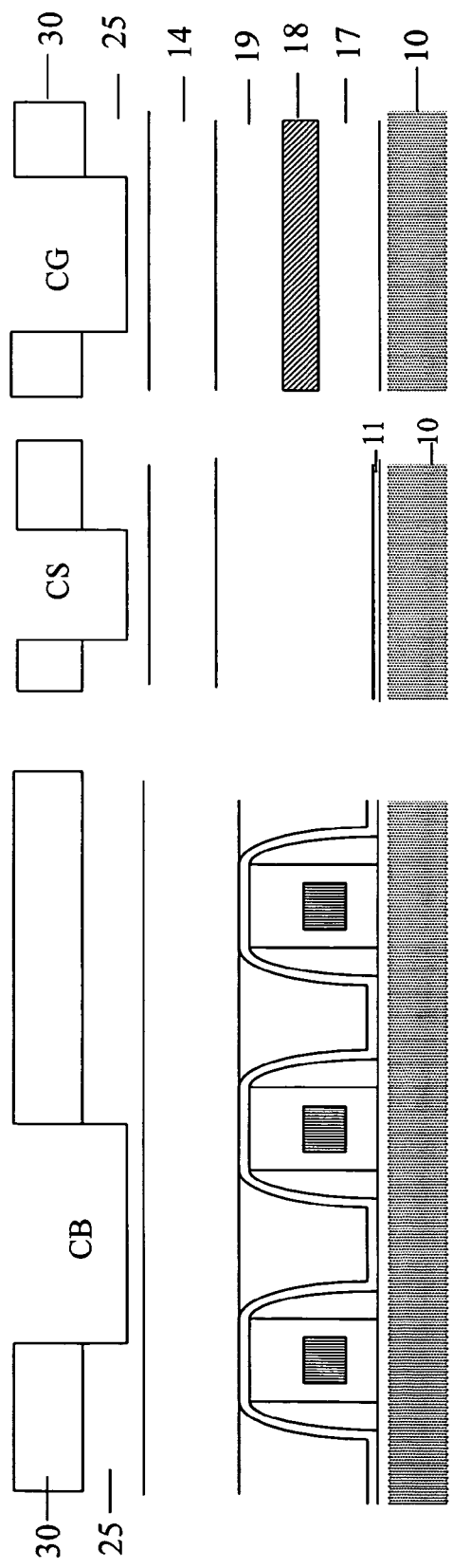
Figure 4F:
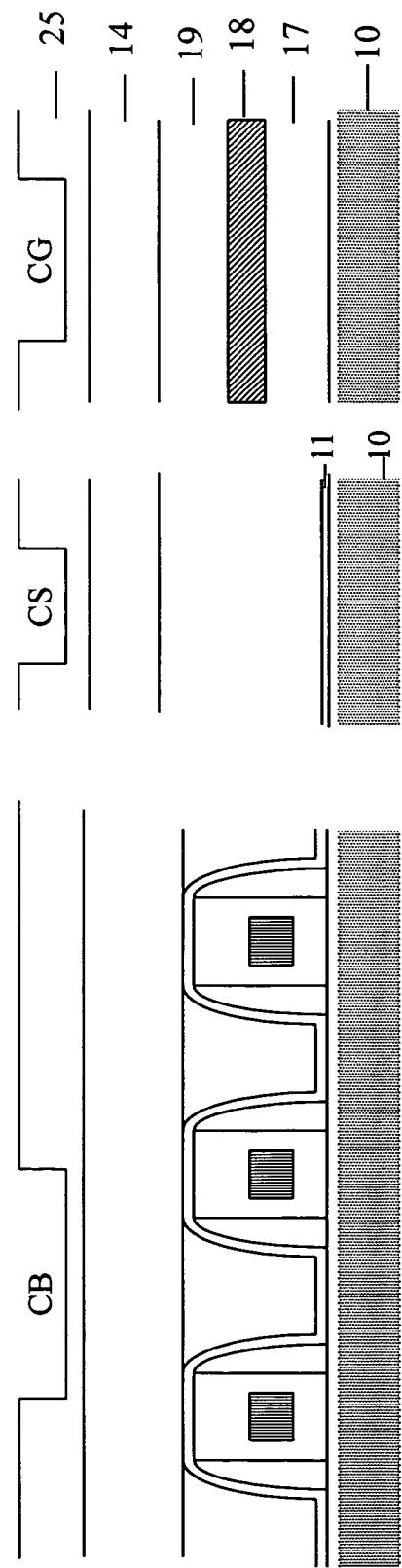
Figure 4G:
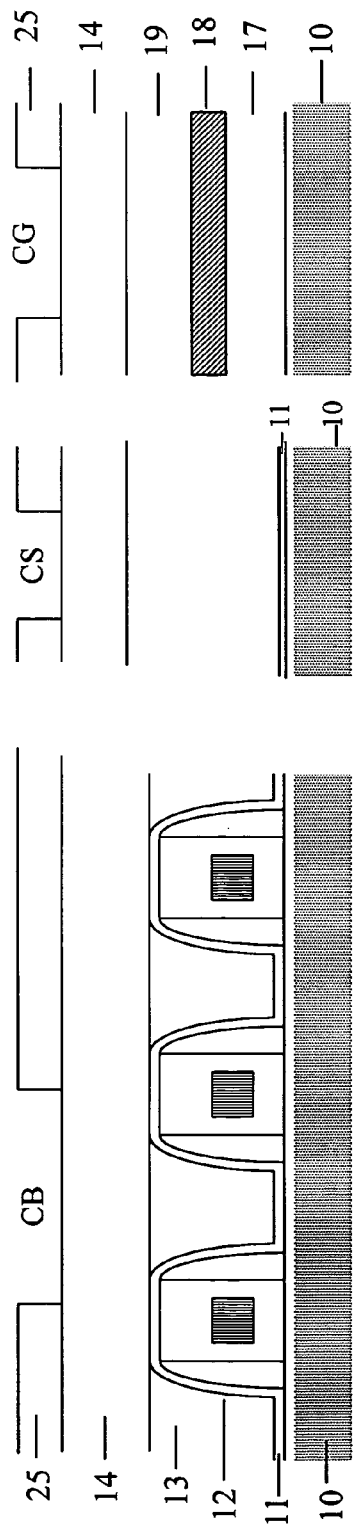

As shown in FIG. 4e, partially removing the portion of the poly-silicon layer 25 not covered by the anti-reflective layer 30 by dry etching, for example, to form recesses corresponding to the respective contact hole positions in the poly-silicon layer 25. For example, the thickness of each recess is less than that of other portions of the poly-silicon layer 25 by about 800 Å. Then, the SiON (anti-reflective) layer 30 is removed by dilute HF etching. As stated above, dilute HF has a large etching selectivity for SiON in respect to poly-silicon. Therefore, the SiON can be easily removed. After the anti-reflective layer 30 is partially removed, as shown in FIG. 4f, the recesses of the poly-silicon are opened to form openings, as shown in FIG. 4g. The remaining poly-silicon layer 25 is used as a mask for the subsequent etching step for forming contact holes.

In the step shown in FIG. 4e, if the openings in poly-silicon 25 are opened by only one operation, due to the characteristics of the etchant and the material of the poly-silicon, the profiles of the openings will be degraded. It is difficult to obtain perfect opening profile. Accordingly, in the present embodiment, the openings in the poly-silicon layer 25 are opened by two steps. That is, the recesses are formed in the poly-silicon layer 25 by partially etching, then the recesses in the poly-silicon layer 25 are opened as openings after the anti-reflective layer 30 is removed.

Figure 4H:
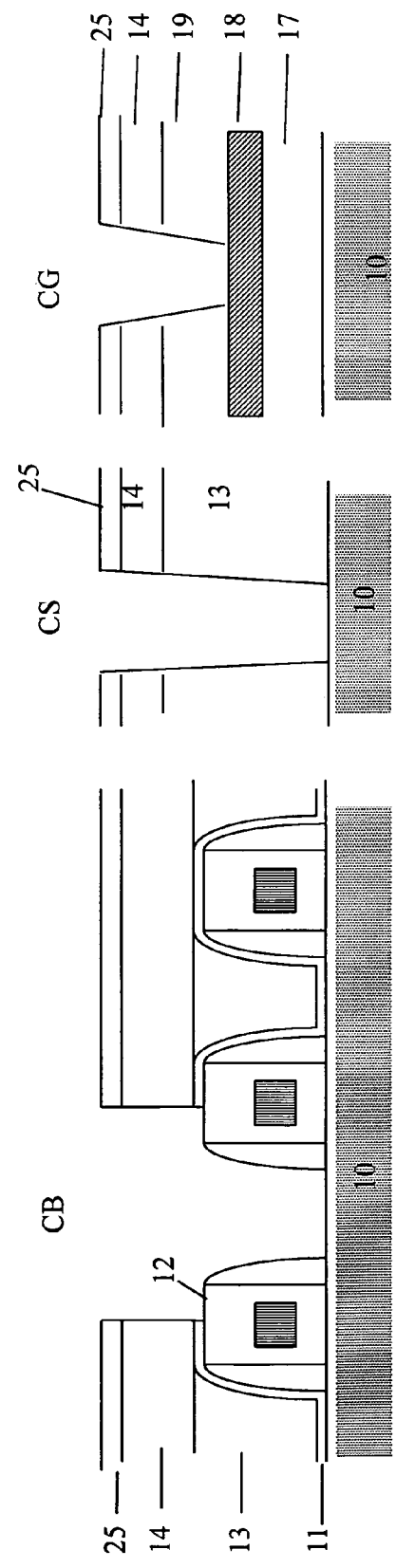

Finally, using the remaining poly-silicon layer 25 as the mask, the portions of the dielectric layer 13, oxide layer 14, cap nitride layer 19 and the like, corresponding to the positions defined by the openings of the poly-silicon layer 25, are removed by etching to form a bit line contact hole CB, a substrate contact hole CS, and a gate contact hole CG and portions of the poly-silicon layer 25 are also removed to thin its thickness, as shown in FIG. 4h.

In accordance with the present invention, the bit line contact hole CB, substrate contact hole CS and gate contact hole CG can be formed at the same time. In addition, it is not necessary to use the poly hard mask to form the contact holes in two stages. The steps of applying and removing the poly hard mask are omitted.

While the embodiment of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A method for forming a contact hole, said method comprising steps of:
   providing a substrate;
   forming a plurality of operation layers on said substrate as required;
   forming a conductive layer on the uppermost one of said operation layers;
   forming an anti-reflective layer on said conductive layer;
   forming a photoresist layer on said anti-reflective layer to define a position where said contact hole is to be formed;
   removing a portion of said anti-reflective layer not covered by said photoresist layer;
   removing said photoresist layer;
   partially removing a portion of said conductive layer not covered by said anti-reflective layer to form a recess, the layer beneath said conductive layer being not exposed from said recess;
   removing said anti-reflective layer;
   opening said recess of said conductive layer to form an opening to expose the layer beneath said conductive layer; and
   using the remaining conductive layer as a mask to form said contact hole by etching.

2. The method as claimed in claim 1, wherein said etching selectivity ratio for said anti-reflective layer in respect to said conductive layer is large.

3. The method as claimed in claim 1, wherein said conductive layer comprises poly-silicon.

4. The method as claimed in claim 1, wherein said anti-reflective layer comprises nitride.

5. The method as claimed in claim 4, wherein said anti-reflective layer comprises SiON.

6. A method for forming a contact hole, said method consisting essentially of:
   providing a substrate;
   forming a plurality of operation layers on said substrate as required;
   forming a conductive layer on the uppermost one of said operation layers;
   forming an anti-reflective layer on said conductive layer;
   forming a photoresist layer on said anti-reflective layer to define a position where said contact hole is to be formed;
   removing a portion of said anti-reflective layer not covered by said photoresist layer;
   removing said photoresist layer;
   partially removing a portion of said conductive layer not covered by said anti-reflective layer to form a recess, the layer beneath said conductive layer being not exposed from said recess;
   removing said anti-reflective layer;

opening said recess of said conductive layer to form an opening to expose the layer beneath said conductive layer; and using the remaining conductive layer as a mask to form said contact hole by etching.

7. The method as claimed in claim 6, wherein said etching selectivity ratio for said anti-reflective layer in respect to said conductive layer is large.

8. The method as claimed in claim 6, wherein said conductive layer comprises poly-silicon.

9. The method as claimed in claim 6, wherein said anti-reflective layer comprises nitride.

10. The method as claimed in claim 9, wherein said anti-reflective layer comprises SiON.

* * * * *